(12) United States Patent
Haas et al.

(10) Patent No.: US 6,673,190 B2
(45) Date of Patent: Jan. 6, 2004

(54) LASABLE BOND-PLY MATERIALS FOR HIGH DENSITY PRINTED WIRING BOARDS

(75) Inventors: David Haas, Westfield, NJ (US); Chengzeng Xu, Succasunna, NJ (US); Mavyn McAuliffe, Waltham, MA (US); Scott Zimmerman, Baskingridge, NJ (US); Laura Miller, Mount Airy, NC (US); Meifang Qin, Branchburg, NJ (US); Baopei Xu, Tewksbury, MA (US); Richard Pommer, Trabuco Canyon, CA (US)

(73) Assignee: Honeywell International Inc., Morristown, NJ (US)

( * ) Notice: Subject to any disclaimer, the term of this patent is extended or adjusted under 35 U.S.C. 154(b) by 238 days.

(21) Appl. No.: 09/826,718

(22) Filed: Apr. 4, 2001

(65) Prior Publication Data

US 2002/0004352 A1 Jan. 10, 2002

Related U.S. Application Data

(62) Division of application No. 09/344,749, filed on Jun. 25, 1999, now Pat. No. 6,245,696.

(51) Int. Cl.⁷ .................................................. B32B 31/00
(52) U.S. Cl. ....................... 156/289; 156/307.3; 29/829; 29/830
(58) Field of Search ............................ 428/209; 29/829, 29/830; 427/96; 156/289, 307.3

(56) References Cited

U.S. PATENT DOCUMENTS 5,888,627 A * 3/1999 Nakatani ..................... 428/209

\* cited by examiner

*Primary Examiner*—Cathy Lam
(74) *Attorney, Agent, or Firm*—Sandra P. Thompson; Bingham McCutchen

(57) ABSTRACT

This invention concerns lasable bond-ply materials comprising a nonwoven reinforcing material and at least one resin material. The present invention also includes methods for using the bond-ply of this invention to manufacture high density multilayer printed wiring boards.

9 Claims, 2 Drawing Sheets

LASABLE BOND-PLY MATERIALS FOR HIGH DENSITY PRINTED WIRING BOARDS

This application is a divisional of U.S. application Ser. No. 09/344,749, filed Jun. 25, 1999, now U.S. Pat. No. 6,245,696.

BACKGROUND OF THE INVENTION (1) Field of the Invention

This invention concerns bond-ply materials comprising at least one resin and at least one nonwoven reinforcing material. The present invention also includes methods for using the bond-ply materials of this invention to manufacture high density multilayer printed wiring boards.

(2) Description of the Art

The electronics industry continues to seek enhanced product performance in order to meet consumer demands for higher functionality and lower cost computers and other electronic devices. Among the methods that the electronic industry is using to increase performance is by designing of multilayer circuit boards that have smaller, finer circuit lines and spaces. Increasing line density leads to fewer circuit layers resulting in smaller electronic devices. The methods for fabrication of multilayer boards are well-known in the art. One commonly used method is to use a joint layer to unite two separate circuit layers. Such joint layer is known in the art as prepreg or bond-ply. Through holes or vias are drilled in the bond-ply and metallized to form electrical interconnections between the circuit layers.

Recently, the industry began migrating towards micro-via technologies to join and electrically interconnect multiple circuit layers. The use of micro-vias, typically smaller than 150 microns in diameter, significantly densifies the circuitry due to reduced amount of board area needed per via. Lasers are used in the printed wiring board industry to drill micro-vias. The methods for using lasers to drill micro-vias in electronic substrates such as films and nonwoven reinforced laminates have been described in the prior art.

The configuration and properties of a bond-ply material significantly affect the fabrication and performance of a multilayer printed wiring board. With increasing circuit density and finer circuit traces it is becoming more important to use bond-plys in the fabrication of high density multilayer wiring boards that have good dimensional stability and that behave uniformly when subjected to environmental stress over dimensions comparable to or smaller than the dimensions of the circuitry to facilitate registration of the vias in the bond-ply with the pads in the circuit layers. Furthermore dimensional uniformity of the bond-ply is also required in order to assure that warping or buckling does not occur after processing and circuit fabrication and assembly. In general it is known that fiber reinforcement moderate of the relatively high thermal coefficient of expansion of polymeric materials, that it provides for mechanical rigidity, and that fiber reinforcement can reduce the brittleness of composite materials. It is also important that the bond-ply can be consistently laser drilled to form micro-vias as mechanical drilling of microvias is inefficient and expensive. Furthermore, it has become important to have a uniform thickness of dielectric material between the circuit layers that are joined by a bond-ply. In general, however, prior art reinforced bond-ply materials are either not sufficiently uniform to prevent warp and buckle or cannot be laser drilled to form uniform micro vias. Prior art reinforced bond-ply materials also are generally insufficiently uniform to provide a consistent and known final dielectric thickness between circuit layers after joining them.

Despite the advancements made in the quality of electronic substrates, there remains a need for improvements. Specifically, there remains a need for a bond-ply that cleanly ablate when lased to produce quality through holes or vias. There also remains a need for reinforced bond-plies with improved dimensional stability and strength. And their remains a need for bond-plies that can be efficiently and effectively used to manufacture high density multilayer wiring boards. There also remains a need for a bond-ply that provides for a uniform and known dielectric thickness between two circuit layers after joining the layers together.

SUMMARY OF THE INVENTION

An object of the present invention is to provide a bond-ply material that has a coefficient of thermal expansion (CTE) that is closely matched to the CTE's of circuit layers associated with the material, that is resistant to moisture absorption, and that has high heat resistance.

Another object of the present invention is to provide a bond-ply material that, after curing, has a high degree of dimensional stability and uniformity when subjected to changing environmental conditions such as temperature and humidity.

Yet another object of the present invention is to provide a bond-ply material that has sufficient resin flow during lamination to fill the spaces between circuit traces yet has a consistent and controlled dielectric spacing between circuit layers.

Still another object of the present invention is to provide a bond-ply material that is amenable to laser via fabrication.

Another object of the present invention is to provide a bond-ply material that creates a uniform and predictable dielectric thickness between circuit layers which it bonds together.

The present invention includes a bond-ply sheet containing a nonwoven reinforced C-staged (predominantly cured) core layer having a first surface and a second surface, a first B-staged (partially cured) resin layer covering the core layer first surface, a second B-staged resin layer covering the core layer second surface, and optionally a release film or layer that covers one or both of the B-stage coatings. The core of the Bond-ply preferably exhibits a thermal expansion coefficient of between 2 and 20 parts per million per Centigrade after curing.

The present invention also includes a bond-ply sheet containing a nonwoven reinforced, partially cured core layer having a first surface and a second surface, a first B-staged resin layer covering the core layer first surface, a second B-staged resin layer covering the core layer second surface, and optionally a release film or layer that covers one or both of the B-staging coatings. The core of the bond-ply preferably exhibits a thermal expansion coefficient of between 2 and 20 parts per million per Centigrade after curing.

The present invention further includes a bond-ply sheet including a nonwoven reinforcing material comprising a mixture of micro-glass fibers and organic fibers or pulps, a B-staged resin, and optionally a release film or layer that covers one or both of the coatings.

The present invention still further includes bond-ply sheets of this invention including at least one microvia hole perpendicular to the plane of the bond-ply sheet, which is filled with an electrically-conductive filler, such as paste or a thermally activated precursor to an electrically-conducting material.

The present invention further includes methods for interconnecting high density electronic circuit layers to manufacture multilayer boards with the bond-ply materials of this invention comprising the steps of drilling holes within the bond-ply material of this invention using a laser or other means, filling the holes with conductive paste or conductor precursor, optionally removing the release film or layers from the bond-ply material, inserting bond-ply material between two planar electronic circuit elements such that the electrically-conductive paste or precursor contacts electrically-conductive circuit regions upon the circuit elements, subjecting the structure to pressures between 0 and 1000 psi and temperature of from 25 to about 400° C. to cause the polymeric coating materials to flow, and optionally subjecting the structure to temperatures and pressures sufficiently high to cure the thermosetting polymers or the thermosetting adhesives and/or to activate the electrically conducting precursor if necessary.

DESCRIPTION OF THE CURRENT EMBODIMENT

The present invention relates to lasable bond-ply sheets containing nonwoven reinforcing materials and resins. The present invention also relates to methods for using the bond-ply sheets of this invention in the manufacture of high density multilayer wiring boards including a plurality of conductively connected circuit layers. The bond-plies of this invention are useful in the manufacture of printed wiring boards, microelectronic packaging substrates, multi-chip modules, and other multi-layer circuit containing electronic products.

Figure 1A:
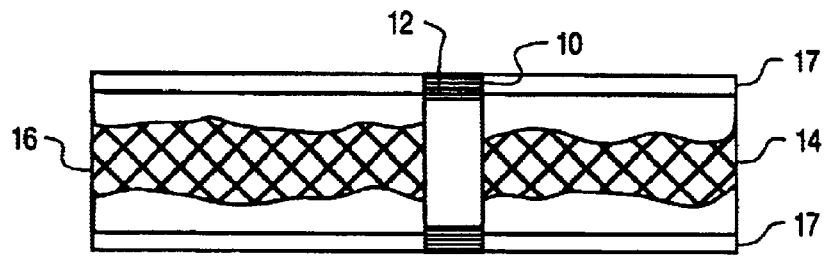
FIGS. 1A, 1B, and 1C are side cut-away views of bond-ply sheets of this invention.
Figure 1B:
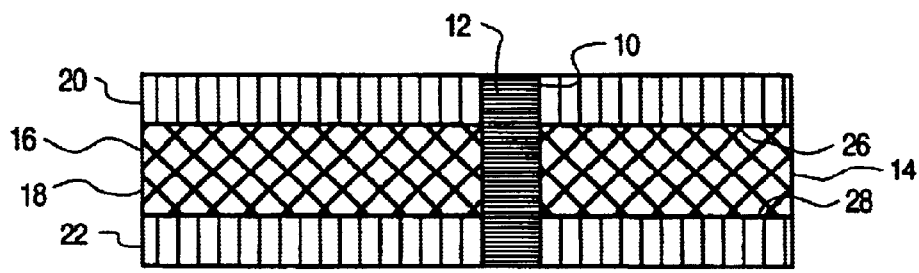
Figure 1C:
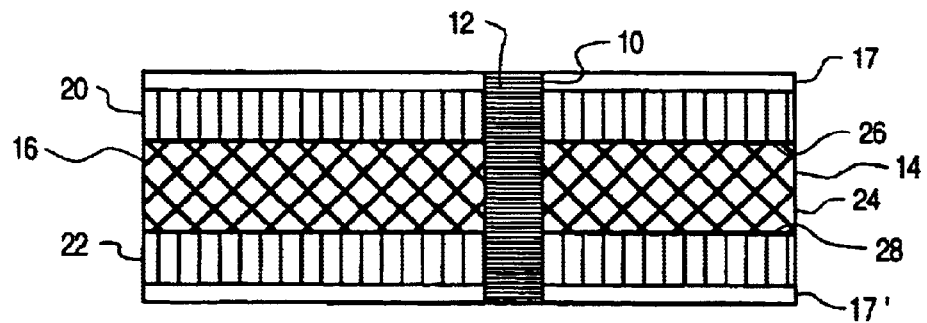

FIGS. 1A, 1B, and 1C depict various embodiments of the bond-plies of this invention. Each of the bond-ply sheets includes a resin layer 14. Resin layer 14 may consist of one or more layers of resin. Furthermore, resin layer 14 may be a B-stage resin, a C-stage resin or a combination thereof. Each of the bond-ply sheets also includes at least one nonwoven reinforcing material 16. Optionally there is a release film or layer 17 that covers the surfaces of the bond-ply sheets for protection during storage, laser drilling and conductive paste filling. The reinforcing material 16 is useful in giving the dielectric layer some inherent strength as well as strengthening multilayer printed wiring boards which incorporate the bond-ply sheets of this invention. The reinforcing material is also useful in controlling the CTE of the bond-ply layer so that it matches the circuit substrate's CTE. Reinforcing material 16 may be any type of nonwoven reinforcing material that is useful in manufacturing dielectric layers and laminates.

Typically bond-ply materials of this invention consists of from about 20 to about 95 wt % resin and from about 10 to about 80 wt % reinforcing material. More preferably the bond-ply materials include from about 45 to about 95 wt % resin and from about 5 to about 55 wt % reinforcing material. Most preferably, the bond-ply materials of this invention include from about 30 to about 80 wt % resin and from about 20 to about 70 wt % non-woven reinforcing material.

The bond-ply material shown in FIG. 1A is manufactured by impregnating the reinforcing material with a resin in a single pass. It is preferred that enough resin is impregnated on the reinforcing material to over saturate the reinforcing material. The reinforcing material used in this bond-ply comprises a mixture of micro-glass fibers and organic fibers or pulps, which allows for manufacture of uniform substrates with high resin content. The over saturated reinforcing material is then cured to B-stage. The B-stage resin impregnated reinforcing material is then lased to produce vias and the vias are filled with a conductive paste. Over saturation of the reinforcing materials ensures that the B-stage bond-ply layer will include a sufficient amount of resin to flow between the circuit traces of the circuit layer during lamination.

FIG. 1B depicts a bond-ply of this invention including a layer of nonwoven reinforced resin core 18 that is sandwiched between two B-stage resin layers 20 and 22. The core provides dimensional stability of the bond-ply and ensures a well defined thickness between two adjacent circuit layers. This bond-ply configuration also permits use of a variety of nonwoven reinforcing materials suitable for electronic substrates. The resin in core 18 can be either fully cured or partially cured. Resin layers 20 and 22 have varied thickness to suit different circuit topography of the boards that the bond-ply will joint. In order to manufacture the bond-ply depicted in FIG. 1B, the core 18 is prepared by impregnating the nonwoven reinforcement material 16 with resin 14 and partially or fully curing the resin 14, optionally using a press, to give a core having a first surface 26 and a second surface 28. A first layer of resin 20 is then applied to the core first surface 26 and a second resin layer 22 is applied to core second surface 28. One or more vias 10 are applied to the bond-ply sheet by lasing and via 10 is filled with conductive paste 12.

The bond-ply sheets depicted in FIG. 1C is manufactured similarly to the bond-plies depicted in FIGS. 1A and 1B, respectively. Release film layers 17 and 17' are applied to resin layers 20 and 22 either before or after vias are lased into the bond-ply material. One or more vias 10 are applied to the bond-ply sheet by lasing and via 10 is filled with conductive paste 12.

The vias may be applied to the bond-ply sheets of this invention by laser drilling. We have discovered that vias formed in fiber reinforced bond-ply layers of this invention include small fiber ends that extend into the via. We have also determined that the fiber ends help secure the conductive paste in the vias. Therefore, it is preferred that the bond-ply layers of this invention include a fibrous reinforcing material.

The bond-plys of this invention will include a plurality of vias. Preferably, the vias are lased microvias that are essentially undamaged. Microvias will typically have diameters ranging from about 5 to 150 micrometers. The term essentially undamaged mean that greater than about 90% of the lased vias have no damage such as melt-back of the resin along the nonwoven fiber, charring of the resin, re-flow of the resin, or excessive debris around the hole.

The bond-ply sheets of this invention will typically have a thickness of from 25 to about 250 microns. It is preferred however that the bond-ply sheets of this invention have a thickness of from about 50 to about 150 microns. When the bond-ply materials include a C-stage core and B-stage outer resin layers, then the thickness of the C-stage core will generally range from about 5 microns to about 200 microns. Preferably the thickness of the C-stage core is no greater than about 100 microns. When the bond-ply of this invention includes one or two B-stage resin layer, then the thickness of each B-stage resin layer will range from about 2 microns to about 200 microns.

Figure 2A:
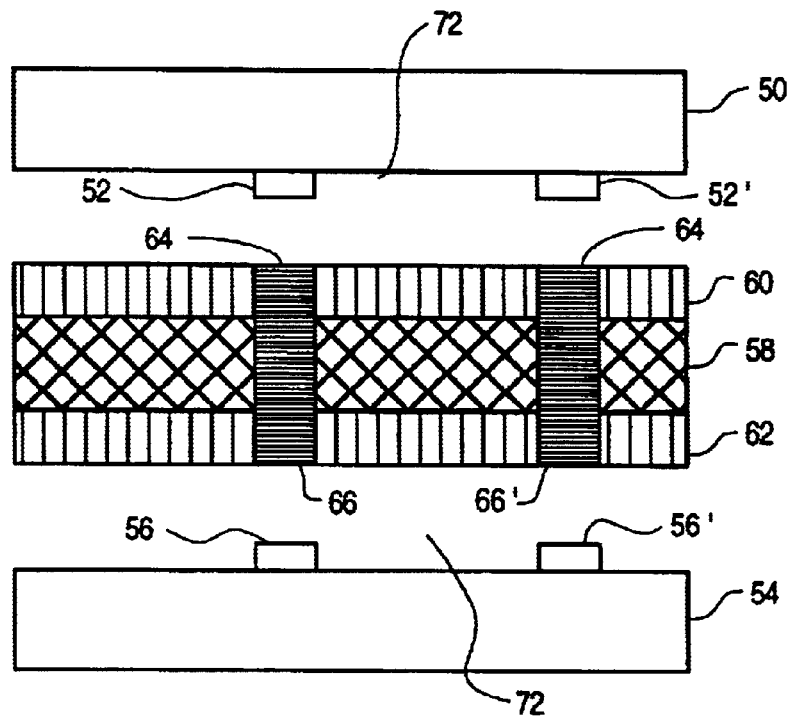
FIGS. 2A–2B are side cut-away views of steps in a process of this invention for using the bond-plies of this invention to conductively joint two circuit layers.
Figure 2B:
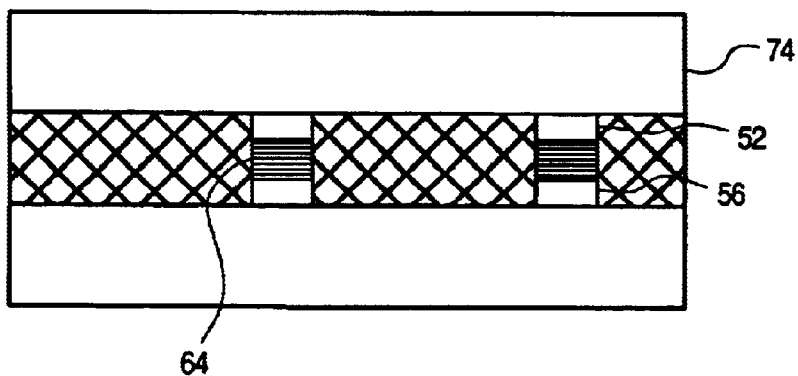

A method for using the bond-plies of this invention to joint circuit layers is depicted in FIGS. 2A and 2B. FIG. 2A shows a first circuit layer 50 including a first circuit trace 52 and a second circuit layer 54 including a second circuit trace 56. A bond-ply layer such as those depicted in FIGS. 1A and 1C of this invention is located between first circuit layer 50 and second circuit layer 54. The bond-ply depicted in FIG. 2A includes a C-staged reinforced core 58, a first B-stage resin layer 60 and a second B-stage resin layer 62. The dielectric layer further includes a plurality of vias 64 each of which is filled with conductive paste 66.

The bond-ply layer of this invention is orientated between first circuit trace 52 and second circuit trace 56 such that conductive paste filled vias 64 and 64' are registered with first circuit trace 52 and 52' respectively and second circuit trace 56 and 56' respectively. The bond-ply layer of this invention is then pressed between first circuit layer 50 and second circuit layer 54 at a temperature of from about 25 to about bout 400° C. (i.e., curing conditions). During curing, the resin from the B-stage resin layers flows into spaces 72 between circuit traces 52 and between circuit traces 56. Also during curing, the conductive paste in vias 64 and 64' conductively joins first circuit trace 52 and 52' with second circuit trace 56 and 56', respectively. Furthermore, if the conductive paste includes a curable resin, the conductive paste will harden to produce a hardened conductive interconnect.

FIG. 2B is a laminate 74 produced using a bond-ply layer of this invention. The laminate includes a first circuit trace layer 52 and second circuit trace 56 which are vertically connected through via 64. The laminate 74 equivalent includes a C-stage dielectric layer separating the conductive traces. The c-stage layer provides an uniform dielectric spacing between first circuit layer 50 and second circuit layer 54.

The reinforcing material may be selected from any fibrous material that is non-woven. Examples of such fibrous materials include glass fibers, glass microfibers, ceramic fibers, silica fibers, organic fibers such as liquid crystal polymer (LCP) fibers, organic microfibers, organic pulps, natural fibers, and mixtures thereof. Examples of preferred fibrous materials include glass microfibers with diameters smaller than 2 microns and Poly(p-phenylene-2,6-benzobisoxazole) (PBO) staples, pulps or microfibers.

It is preferred that the reinforcing material is present in the bond-plies of this invention in an amount sufficient to allow the electronic substrate to match the CTE of metal layers associated with the substrate and preferably in an amount ranging from about 5 to about 55 wt % and most preferably in an amount ranging from about 20 to about 40 wt %. When the reinforcing material is a combination of glass microfibers and organic microfibers, then it is preferred that the reinforcing material comprises from about 10 to about 90 wt % non-woven organic fibers, microfibers and pulps and from about 10 to about 90 wt % glass microfibers. It is most preferred that the reinforcing material comprises from about 30 to about 70 wt % non-woven organic fibers, microfibers and pulps and from about 30 to about 70 wt % non-woven glass microfibers.

The glass microfibers may be any type of glass materials. The term glass is used herein to refer to silica and silicate containing fibers including E-glass, B-glass, D-glass, M-glass, and mixtures thereof. Preferred micro-glass fibers have diameters smaller than 5 microns. Most preferred micro-glass fibers have diameters smaller than 1 micron.

The reinforcing materials used in this invention may also include non-woven organic fibers. The non-woven organic fibers may be selected from fibers containing organic materials. Such fibers include naturally occurring fibers and manmade polymeric fibers. Preferred nonwoven fibrous materials include but not limited to fibers and pulps of liquid crystal polymers such as polyaramids (e.g., Kevlar from DuPont and Twaron from Akzo Nobel), polyesters (e.g., Vectra from Hochest), poly(p-phenylene-2,6-benzobisoxazole)(PBO)(e.g., Zylon from Toyobo) and mixtures thereof.

Other known ingredients may be included in the reinforcing materials used in this invention, including powder fillers, coupling agents and binding agents which aid in the binding of the resin to fabric reinforcing materials.

The electrically conductive material may be any conductive paste or conductor precursor, which generates a conductive material upon heat treatment, that is known in the art to be useful in the manufacture of electronic substrates. The conductive material may be a paste, an ink, a polymer or mixtures thereof. Useful conductive materials are disclosed in U.S. Pat. Nos. 5,223,033 and 5,397,383, the specifications of which are incorporated in their entirety herein by reference.

An example of a useful conductive material is a conductive paste. The electronics industry uses particulate-based high-solid conductive pastes to provide conductive or dielectric capability in an electronic component. These pastes typically contain inorganic particles and an organic medium or vehicle. The inorganic particles provide the electrical functionality in the ultimate application, i.e., insulative or non-conducting inorganic particles form dielectric parts, and conductive inorganic particles, primarily metals, form conductive parts. The organic medium facilitates application and control of the location of the inorganic particles. After application of the paste, the organic medium is removed and/or cured by heating and the inorganic particles are fused to form the electrically functional part. Application methods, such as stencil or screen printing, pressure dispensing, syringe dispensing, etc. may be used to apply the material to the desired locations in the desired patterns.

The bond-ply layers of this invention can optionally include a polymer or metal foil release film layer covering one or both bond-ply surfaces. If used, the release film preferably is a flexible, dimensionally stable material with good tear and chemical resistances. Suitable release film materials include polymeric film or metal foils. A metal foil is preferred because metal foils tend to have high tensile strength at elevated temperatures, low absorbed moisture, and low residual solvent. A preferred release film is electroplated copper foil, polyimide film, or a polyester film.

It is preferred that the release film is copper foil. The preferred copper foil release film layer may be used shiny side up or down. It is also preferred that vias are lased or drilled into the bond-ply layer before the release film layer is removed. There are several advantages to using release film layers on the bond-plys of this invention. One advantage is that removing the release film after the vias are filled leaves nubbins on the bond-ply surface that promotes good contact between the bond-ply conductor filled via and the circuit trace associated with the substrate to which the bond-ply is being adhered. Also, the release film prevents the conductive material from contaminating the bond-ply surface prior to use.

Bond-ply materials including a non-woven reinforcing materials made from non-woven micro-fiber glass and non-woven organic microfiber or pulp materials have fibers with diameters about a factor of ten times smaller than are present in woven glass fabrics. In addition, the preferred micro fibers used in the nonwoven reinforcing materials are distributed more uniformly than the glass fibers in woven glass fabrics. The small diameters of the fibers and their uniform distribution in the nonwoven reinforcing material allow for the manufacture of uniform, thin bond-ply sheets that can be easily lased to yield good quality via grids.

Bond-plies of this invention are manufactured by impregnating the chosen nonwoven reinforcing material with an appropriate resin. The resin will typically consist of at least one polymer as well as any other materials known in the art as being useful in electronic substrates that provide the desired strength, durability, heat resistance, water resistance and so forth, to the materials manufactured from the resin. Suitable polymers include thermosetting resins such as epoxies, cyanate esters, polyimides, acetylene containing resins, silicones, urethanes, acrylates, and thermoplastic polymers such as polyethers, polyesters, polyimides, polyolefins. Some examples of resin additives include, chain extenders, curing agents, catalysts, reactivity controllers and so forth. Examples of thermosetting resin systems useful in manufacturing electronic substrates are described in U.S. Pat. Nos. 5,508,328, 5,620,789, 5,534,565 and U.S. Provisional Application Serial No. 60/019,853 each of which are incorporated herein by reference. Another resin system example is set forth in PCT/EP97/05308 which is also incorporated herein by reference. Examples of thermoplastic polymers include high temperature engineering thermoplastic polymers such as polyether ether ketone (PEEK), polyphenylene sulfur (PPS), thermoplastic polyimides, indane epoxy, and mixtures thereof.

The thermosetting resin is cured to a degree sufficient to achieve the desired amount of flow upon subsequent use of the dielectric in the manufacture of a PWB. This impregnation and partial curing (treating) steps are preferentially performed in a roll to roll process such as is currently used for manufacture of PWB prepregs based on woven glass fabric. The degree of cure of the B-stage resin is typically below 50%. The amount of resin and the degree of cure are adjusted to give the desired flow of resin depending upon the prepreg and bond-ply end use. There should be enough resin in the bond-ply to allow the resin to flow and cover the circuitry traces when it is pressed onto the circuit layers of the PWB. If the resin used is a thermoplastic, not a thermoset, it can be pressed onto the fabric from one or preferentially both sides using a heated platen or belt press.

EXAMPLE 1

A Thermount® E-200 non-woven fabric available from DuPont is impregnated with an epoxy resin solution containing Dow Chemical XUR-1544-55284-24 epoxy mixture (200 parts by weight), elf Autochem SMA EF-30 styrene maleic anhydride (150 parts by weight), propylene glycol methyl ether acetate (150 parts by weight), methyl ethyl ketone (75 parts by weight), and 2-ethyl-4-methyl imidazole (EMI, 0.15 part by weight), and dried and partially cured at 165° C. for 3 minutes in an oven to obtain a prepreg containing about 50% by weight of resin. The partially cured laminate is pressed and cured at 200° C. for 2 hours under 350 psi to obtain a C-stage core. Separately the same epoxy resin is coated on an 18 micron copper foil and dried at 150° C. for 2 min. to remove solvents and form a 25 micron coating. The coated copper foil is then laminated to the C-stage core on both sides using a hot roll laminator at 160° C. and 60 psi to form a bond-ply sheet with a c-stage core and a b-stage layer associated with each core surface. The b-stage layer each include copper foil protection sheets. This bond-ply sheet is then lased to form 3 mil via holes. The holes are filled with a Ormefill™ conductive ink available from Ormet Corp. After peeling off the copper foils the bond-ply is laminated to two circuit layers using a vacuum press at 220° C. for 2 h.

EXAMPLE 2

A Thermount® E-200 non-woven fabric available from DuPont is impregnated with an epoxy resin solution containing Dow Chemical XUR-1544-55284-24 epoxy mixture (200 parts by weight), elf Autochem SMA EF-30 styrene maleic anhydride (150 parts by weight), propylene glycol methyl ether acetate (150 parts by weight), methyl ethyl ketone (75 parts by weight), and 2-ethyl-4-methyl imidazole (EMI, 0.15 part by weight), and dried and partially cured at 165° C. for 3 minutes in an oven to obtain a prepreg containing about 50% by weight of resin. Separately, a second epoxy resin comprising Shell Chemical EPON 1031 (80 parts by weight), EPON 828 (10 parts by weight), Phenoxy Specialties PKHS-40 (25 parts by weight), dicyandiamide (5 parts by weight), dimethylformamide (50 parts by weight), methyl ethyl ketone (20 parts by weight), and 2-ethyl-4-methyl imidazole (0.02 parts by weight) is coated on an 18 micron copper foil and dried at 150° C. for 2 min. to remove solvents and form 25 and 15 micron coatings, respectively. The coated copper foil is then laminated to the partially cured Thermount® reinforced core on both sides using a hot roll laminator at 160° C. and 60 psi to form a b-stage bond-ply sheet with copper foil protection sheets. This bond-ply sheet is then lased to form 3 mil via holes. The holes are filled with a Ormefill™ conductive ink available from Ormet Corp. After peeling off the copper foils the bond-ply is laminated to two circuit layers using a vacuum press at 220° C. for 2 h.

EXAMPLE 3

A wet-laid nonwoven fabric is made from 50 wt. % 608M micro-fiber glass, 15 wt. % PBO pulp, and 35 wt. % 3 mm long cut PBO staple fibers. The 608M micro-glass is obtained from Evanite Fiber Corporation. The PBO staple fibers obtained from Toyobo Co. under the trade name of Zylon. The PBO pulp is made from the staple fibers by a mechanical pulping process in a water-slurry. A half cup water is mixed with about two grams of chopped staple fiber and processed to pulp by blending in a regular blender for 4 hours. The fabric is made using a wet-lay process in a commercially available sheet mold. A dilute, well-dispersed mixture of the components is prepared in water. This mixture is poured into the mold and the drain is opened pulling the mixture through the screen of the mold, and depositing the non-woven fabric onto the screen. This sheet of fabric is removed from the screen and dried. The mold used makes a 12.125 inch by 12.125 inch square of fabric. The fabric weight is about 3 grams and it measures about 3 to 4 mil thick.

EXAMPLE 4

The 12×12 inch nonwoven fabric made in Example 3 is impregnated with an epoxy resin system containing Shell Chemical EPON 1031 (80 parts by weight), EPON 828 (10 parts by weight), Phenoxy Specialties PKHS-40 (10 parts by weight), dicyandiamide (5 parts by weight), dimethylformamide (50 parts by weight), methyl ethyl ketone (20 parts by weight), and 2-ethyl-4-methyl imidazole (0.02 parts by weight), and dried at 150° C. for 2 min. to remove solvents and to form a prepreg with about 70 wt % resin. Two pieces 12×12 inch 18 micron copper foil were laminated to the prepreg with a hot roll laminator at 150° C. and 60 psi. This bond-ply sheet is then lased to form 3 mil via holes. The holes were filled with a Ormefill™ conductive ink available from Ormet Corp. After peeling off the copper foils the bond-ply was laminated to two circuit layers using a vacuum press at 220° C. for 2 h to form a multilayer circuit board.

EXAMPLE 5

A cyanate ester resin solution available from Ciba Chemical Corp. under the trade name of Arocy B-40S is diluted with methyl ethyl ketone to about 25 wt % resin. A 12×12 inch nonwoven fabric made in Example 3 is impregnated with this diluted cyanate ester solution and dried in a 110° C. oven for 2 min. to form prepreg with about 50% resin content. This prepreg is subsequently cured at 177° C. for 1 hour in a Carver press under 350 psi pressure to form a laminate with about 75% cure degree. Separately an epoxy resin comprising Shell Chemical EPON 1031 (80 parts by weight), EPON 828 (10 parts by weight), Phenoxy Specialties PKHS-40 (10 parts by weight), dicyandiamide (5 parts by weight), dimethylformamide (50 parts by weight), methyl ethyl ketone (20 parts by weight), and 2-ethyl-4-methyl imidazole (0.02 parts by weight) is coated on an 18 micron copper foil and dried at 150° C. for 2 min. to remove solvents and form a 25 micron coating. The coated copper foil is then laminated to the partially cured laminate core on both sides using a hot roll laminator at 150° C. and 60 psi to form a B-stage bond-ply sheet with copper foil protection sheets. This bond-ply sheet is then lased to form 100 micrometer via holes. The holes are filled with a Ormefill™ conductive ink available from Ormet Corp. After peeling off the copper foils the bond-ply is laminated to two circuit layers using a vacuum press at 220° C. for 2 h.

EXAMPLE 6

The nonwoven fabric prepared in Example 3 is impregnated with an epoxy resin solution containing Dow Chemical XUR-1544-55284-24 epoxy mixture (200 parts by weight), elf Autochem SMA EF-30 styrene maleic anhydride (150 parts by weight), propylene glycol methyl ether acetate (200 parts by weight), methyl ethyl ketone (100 parts by weight), and 2-ethyl-4-methyl imidazole (EMI, 0.15 part by weight), and dried and partially cured at 165° C. for 3 minutes in an oven to obtain a prepreg containing about 55% by weight of resin. The partially cured laminate is pressed and cured at 200° C. for 2 h under 350 psi to obtain a C-stage core. Separately an epoxy resin comprising Shell Chemical EPON 1031 (80 parts by weight), EPON 828 (10 parts by weight), Phenoxy Specialties PKHS-40 (10 parts by weight), dicyandiamide (5 parts by weight), dimethylformamide (50 parts by weight), methyl ethyl ketone (20 parts by weight), and 2-ethyl-4-methyl imidazole (0.02 parts by weight) is coated on an 18 micron copper foil and dried at 150° C. for 2 min. to remove solvents and form a 25 micron coating. The coated copper foil is then laminated to the partially cured laminate core on both sides using a hot roll laminator at 150° C. and 60 psi to form a bond-ply sheet having a C-stage core, a B-stage resin layer associated with each core surface. The B-stage resin layers are covered with copper foil protection sheets. This bond-ply sheet is then lased to form 100 micrometer via holes. The holes are filled with a Ormefill™ conductive ink available from Ormet Corp. After peeling off the copper foils the bond-ply is laminated to two circuit layers using a vacuum press at 220° C. for 2 h.

What we claim is:

1. A method for interconnecting high density electronic circuits comprising the steps of:

(a) forming a bond-ply material comprising a core having a first surface and a second surface wherein the core has a thickness of from about 5 microns to 200 microns and including from about 20 to 70 weight % non-woven reinforcement material selected from glass microfibers, organic fibers and mixtures thereof impregnated with a polymer, the bond-ply material also comprising a B-stage resin layer having a thickness of from about 2 micrometers to about 200 micrometers covering the core first surface, the core second surface, or both the core first surface and the core second surface;

(b) forming a plurality of vias in the bond-ply material;

(c) filling the vias with an electrically conductive material selected from a conductive paste or conductor precursor;

(d) placing the bond-ply material between a first circuit element having at least one circuit region and a second circuit element having at least one circuit region such that the electrically conductive material located in at least one via contacts at least one circuit region associated with the first circuit element and at least one circuit region associated with the second circuit element to form an uncured multi-layer circuit; and (e) curing the uncured multi-layer circuit at a pressures of from 0 to 1000 psi and at a temperature of from 25 to about 400° C. to form a cured multi-layer circuit.

2. The method of claim 1 wherein the electrically conductive material is a conductor precursor that is activated by curing.

3. The method of claim 1 wherein the formed bond-ply material comprises a first copper release film covered B-stage resin layer covering the core first surface and a second copper release film covered B-stage resin layer covering the core second surface and the copper release films covering each B-stage resin layer are removed prior to placing the bond-ply material between the first circuit element and the second circuit element.

4. The method of claim 1 wherein the core of the bond-ply material is a C-stage core.

5. The method of claim 1 wherein the bond-ply nonwoven reinforcing material is a mixture of micro-fiber glass and organic fibers.

6. The method of claim 5 wherein the bond-ply material includes from about 30 to about 80 wt % polymer selected from a thermoplastic polymer and a B-stage thermosetting resin and mixtures thereof.

7. The method of claim 5 wherein the nonwoven reinforcing material includes
   from about 10 to about 90 wt % of micro-fiber glass and from about 10 to about 90 wt % of a second reinforcing material selected from organic fibers, organic microfibers, organic pulp and mixtures thereof.

8. The method of claim 6 wherein the organic fibers are selected from Poly(p-phenylene-2,3-benzobisoxazole) staple fibers, pulp, microfibers and mixtures thereof.

9. The method of claim 1 wherein the vias are essentially undamaged microvias having diameters of from 0.5 to 6.0 mils.

* * * * *